United States Patent
White et al.

(10) Patent No.: US 12,203,022 B2
(45) Date of Patent: *Jan. 21, 2025

(54) FORMULATIONS FOR HIGH SELECTIVE SILICON NITRIDE ETCH

(71) Applicant: ENTEGRIS, INC., Billerica, MA (US)

(72) Inventors: Daniela White, Ridgefield, CT (US); David Kuiper, Brookfield, CT (US); Susan Dimeo, New City, NY (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/855,603

(22) Filed: Jun. 30, 2022

(65) Prior Publication Data
US 2022/0333012 A1 Oct. 20, 2022

Related U.S. Application Data

(63) Continuation of application No. 17/000,045, filed on Aug. 21, 2020, now Pat. No. 11,421,157.

(51) Int. Cl.
*C09K 13/08* (2006.01)
*C09K 13/06* (2006.01)
*H01L 21/311* (2006.01)

(52) U.S. Cl.
CPC .............. *C09K 13/08* (2013.01); *C09K 13/06* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 8,409,997 B2 | 4/2013 | Wei | |
| 8,940,182 B2 | 1/2015 | Hong | |
| 2004/0033764 A1 | 2/2004 | Lee et al. | |
| 2004/0152789 A1 | 8/2004 | Chane-Ching et al. | |
| 2008/0203060 A1 | 8/2008 | Hara | |
| 2009/0291872 A1 | 11/2009 | Bara | |
| 2010/0176082 A1 | 7/2010 | Cooper et al. | |
| 2018/0127592 A1 | 5/2018 | Lei | |
| 2018/0142151 A1 | 5/2018 | Lee | |
| 2018/0337253 A1 | 11/2018 | Bilodeau | |
| 2019/0040317 A1 | 2/2019 | Horita | |
| 2019/0211227 A1 | 7/2019 | Dockery | |
| 2019/0211228 A1 | 7/2019 | Ward et al. | |
| 2019/0284704 A1 | 9/2019 | Ge et al. | |
| 2020/0071614 A1* | 3/2020 | Kim | H01L 21/31111 |
| 2020/0157423 A1* | 5/2020 | Bilodeau | C09K 13/04 |
| 2021/0054287 A1* | 2/2021 | White | C09K 13/08 |
| 2022/0363990 A1* | 11/2022 | Wu | C09K 13/00 |

FOREIGN PATENT DOCUMENTS

| | | |
|---|---|---|
| CN | 1954017 A | 4/2007 |
| CN | 109749743 A | 5/2019 |
| JP | 63241030 A | 10/1988 |

(Continued)

*Primary Examiner* — Allan W. Olsen (57) ABSTRACT

Compositions useful for the selective removal of silicon nitride materials relative to polysilicon, silicon oxide materials and/or silicide materials from a microelectronic device having same thereon are provided. The compositions of the invention are particularly useful in the etching of 3D NAND structures.

10 Claims, 2 Drawing Sheets

(56) References Cited

FOREIGN PATENT DOCUMENTS

| | | | |
|---|---|---|---|
| JP | H01207325 | A | 8/1989 |
| KR | 20180058610 | A | 6/2018 |
| KR | 20190040743 | A | 4/2019 |
| KR | 20190081343 | A | 7/2019 |
| TW | 201540782 | A | 11/2015 |
| WO | 2020102228 | A1 | 5/2020 |

* cited by examiner

FORMULATIONS FOR HIGH SELECTIVE SILICON NITRIDE ETCH

CROSS-REFERENCE TO RELATED APPLICATIONS

This application is a continuation application of U.S. patent application Ser. No. 17/000,045, filed Aug. 21, 2020, which claims the benefit under 35 USC § 119 of U.S. Provisional Patent Application No. 62/888,256, filed Aug. 21, 2019, the entirety of which is incorporated herein by reference.

FIELD OF THE INVENTION

The present invention relates to a composition and method for selectively etching silicon nitride in the presence of silicon oxide, polysilicon and/or metal silicides, and more particularly to a composition and method for effectively and efficiently etching a layer of silicon nitride at a high etch rate and with high selectivity with respect to exposed or underlying layers of silicon oxide, polysilicon and/or metal silicides, particularly in a multilayer semiconductor wafer structure.

BACKGROUND OF THE INVENTION

With the continued demand for improved microelectronic device performance there is a continued emphasis on decreasing device dimensions, which provides the dual advantages of dramatically increasing device density as well as improving device performance. Device performance is improved because decreased device dimensions result in shorter paths that need to be traveled by charge carriers, e.g., electrons.

For example, Metal-Oxide-Semiconductor Field-Effect Transistors (MOSFET) gate electrodes have as electrical points of contact the gate surface and the source and drain regions. The distance between the source and drain regions forms the channel length of the gate electrode, and as such, by decreasing device dimensions the channel length is concomitantly decreased. The result is that the switching speed of the device is increased.

It is self-evident that reducing device dimensions results in increased packaging density of devices on a microelectronic device chip. This increased packaging density brings with it sharp reductions in the length of the interconnect paths between devices, which reduces the relative negative impact (such as resistive voltage drop, cross talk or RC delay) that these interconnect paths have on overall device performance.

Such requirements however cause problems of increased parasitic capacitance, device contact resistance (gate, source and drain contacts in MOSFET devices), and tight tolerance of pattern definition. For very small sub-micron or sub-half-micron or even sub-quarter-micron modern silicon devices, the conventional photolithographic technique for patterning contacts will not meet the required tolerance of critical dimensions. Methods that have been explored to improve resolution and feature size include the formation of a self-aligned poly-silicon (poly-Si) gate structure, which helps to solve the problem of critical dimension tolerance. Using this method, the contact points that are formed for the source and the drain of the gate electrode self-align with the poly-Si gate.

One problem encountered during the formation of self-aligned gate structures has been the selective removal of silicon nitride materials relative to polysilicon, silicon oxide and/or metal silicide materials. For example, during the anisotropic etching of the silicon nitride layer covering the gate electrodes, the underlying silicon oxide layer and silicon substrate are often damaged as well, causing a deteriorated reliability of a semiconductor device.

Conventional wet etching techniques for selectively removing silicon nitride ($Si_3N_4$) have utilized hot (approximately 145-180° C.) phosphoric acid ($H_3PO_4$) solutions with water, typically 85% phosphoric acid and 15% water (by volume). Using fresh hot phosphoric acid, the typical $Si_3N_4$:$SiO_2$ selectivity is about 40:1. Advantageously, as the nitride layer is removed, hydrated silicon oxide forms, which consistent with Le Chatelier's principle, inhibits the additional removal of silicon oxide from the device surface; thus selectivity gradually increases with use. Disadvantages associated with the use of hot phosphoric acid etches include the corrosion of metal silicide materials, e.g., gate contact materials, the etching of silicon oxide, and process control due to the difficultly associated with maintaining a specific amount of water in the process solution. In addition, hot phosphoric acid has been a difficult medium to adapt to single wafer tools, which have become increasingly preferred by many manufacturers.

Another way to selectively remove silicon nitride includes the use of a composition including hydrofluoric acid, however, said compositions also remove silicon oxides. A $Si_3N_4$:$SiO_2$ selectivity of about 10:1 can be achieved through dilution; however, the etch rate of silicon nitride is compromised or above-ambient pressure must be used. Still another process to remove silicon nitride includes the dry etch removal using halogenated gaseous species; however, the $Si_3N_4$:$SiO_2$ selectivity ratio is even worse than that obtained using the aforementioned wet etch processes.

3D-NAND structures in development today at all the major memory chip manufacturers require high-selectivity etching of silicon nitride (SiN) out of high aspect ratio "slits" defined by oxide (PETEOS). In the regular hot phosphoric acid "hot phos" process the selectivity is controlled by pre-dissolving a certain amount of nitride. The dissolved silicon nitride is converted into slightly soluble oxide; the same happens during etching, but the oxide soon starts depositing near the slits' openings, eventually blocking them. See also US 2017/0287725, in particular FIG. 1D, which shows an illustration where the deposition of colloidal silica tends to "pinch off" the gaps or trenches in the microelectronic device. As a result, the process window of pre-etch oxide concentration is very narrow, difficult to control, and the etch bath has to be replaced very often. Oxide re-deposition rate thus needs to be minimized.

In addition, the deep slits take a long time to etch (typically >1 hour). Addition of HF in small amounts increases etch rates, but also polymerization of soluble silica species and consequently oxide re-deposition rates. Furthermore, the volatility of HF and related fluorinated species causes process control difficulties.

In planar NAND technology, scaling is driven mostly by lithography. In scaling 3D NAND, extreme precision and process repeatability is required to create complex 3D structures with very high-aspect-ratio (HAR) features. Therefore, achieving success with 3D NAND requires innovative patterning solutions that minimize variability. (See Overcoming Challenges in 3D NAND Volume Manufacturing. Solid State Technology website: http://electroig.com/blog/2017/07/overcoming-challenges-in-3d-nand-volume-manufacturing/)

Precision in etching extreme HAR features is critical for optimizing channel holes and trenches for cell access, as well as its unique staircase structure architecture, which connects the cells to surrounding CMOS circuitry for reading, writing, and erasing data. If the vertical pitch of the memory stack is around 50 nm, then a 96 layer stack is on the order of 4.8 µm high. This corresponds to a challenging aspect ratio of ~100:1.

Additionally, as multilayer stack heights increase, so does the difficulty in achieving consistent etch and deposition profiles at the top and the bottom of the memory array. For example, given a ratio of ~100:1, the selective removal of $Si_3N_4$ in the memory stack becomes a wet-etch challenge. The difficulty is removing the $Si_3N_4$ consistently at the top and the bottom of the stack and across the wafer, without etching any of the $SiO_2$. Below 96 layers, this task is performed using hot phosphoric acid (~160° C.); however, at 96 layers and above, a specially formulated wet etch chemistry is needed to improve process margin.

SUMMARY OF THE INVENTION

In one aspect, the invention provides compositions useful in etching a substrate having a surface comprising silicon nitride and silicon oxide, with selectivity for etching the silicon nitride relative to the silicon oxide. The composition comprises phosphoric acid, at least one compound chosen from tetraalkyldisiloxane-silyldiamines;
linear and cyclic alkylsilazanes,
1,2 bis(n-aminoalkoxy) tetraalkyldisiloxanes,
alkyl, aryl, alkenyl, heteroalkyl/aryl boronic acids,
tungstosilicic acid,
phosphotungstic acid,
poly(vinyl alcohol),
poly(vinylpyrrolidone),
O-phosphorylethanolamine,
phosphorylcholine,
phosphatidylserine
trialkylsilylamines,
trialkylsilylurea, and
trialkylsilylcarbamates.
a solvent comprising water, and optionally a fluoride compound.

DETAILED DESCRIPTION OF THE INVENTION

One aspect of the present invention relates to compositions which are useful in the selective removal of silicon nitride relative to polysilicon (poly-Si) and silicon oxide material deposited from a silicon oxide precursor source, and hence useful as wet etchants for at least partial removal of silicon nitride material from a microelectronic device. Metal silicide materials that may be present should not be substantially corroded by said removal compositions.

The invention also provides methods, processes, and systems for using the wet etching compositions to remove silicon nitride from a substrate containing silicon nitride and silicon oxide. The compositions can produce an advantageously high etch rate of silicon nitride, an advantageously high selectivity of silicon nitride relative to silicon oxide, or an advantageous balance of these performance properties.

For ease of reference, "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly.

As used herein, "suitability" for removing silicon nitride material from a microelectronic device having such nitride material thereon corresponds to at least partial removal of silicon nitride material from the microelectronic device.

As used herein, "silicon nitride" and "$Si_3N_4$" correspond to pure silicon nitride ($Si_3N_4$) as well as impure silicon nitride including hydrogen, carbon and/or oxygen impurities in the crystal structure.

As used herein, "silicon oxide" refers to thin films made of silicon oxide (SiOx), e.g., $SiO_2$, "thermal oxide" (ThOx), and the like. The silicon oxide can be placed on the substrate by any method, such as by deposition via chemical vapor deposition from TEOS or another source, or by being thermally deposited. The silicon oxide generally contains a commercially useful low level of other materials or impurities. The silicon oxide may be present as part of a microelectronic device substrate as a feature of the microelectronic device, for example as an insulating layer.

As used herein, "at least partial removal of silicon nitride material" corresponds to the removal of at least a portion of the exposed silicon nitride layer.

For example, partial removal of silicon nitride material includes the anisotropic removal of a silicon nitride layer that covers/protects the gate electrodes to form a $Si_3N_4$ sidewall. It is also contemplated herein that the compositions of the present invention may be used more generally to substantially remove silicon nitride material relative to polysilicon and/or silicon oxide layers. In those circumstances, "substantial removal" is defined in one embodiment as at least 90%, in another embodiment at least 95%, and in yet another embodiment at least 99% of the silicon nitride material is removed using the compositions of the invention.

As used herein, "about" is intended to correspond to +/−5% of the stated value.

As used herein, "metal silicide" corresponds to any silicide including the species Ni, Pt, Co, Ta, Mo, W, and Ti, including but not limited to $TiSi_2$, NiSi, $CoSi_2$, NiPtSi, tantalum silicide, molybdenum silicide, and tungsten silicide.

"Silicic acid" is a general name for a family of chemical compounds of silicon, hydrogen, and oxygen, with the general formula $[SiO_x(OH)_{4-2x}]_n$, and includes the compounds metasilicic acid (($H_2SiO_3)_n$), orthosilicic acid ($H_4SiO_4$), disilicic acid ($H_2Si_2O_5$), and pyrosilicic acid ($H_6Si_2O_7$). Silicic acid can be obtained in many ways well known to those skilled in the art, e.g. by hydrating fine silica powder (preferably 1 µm diameter or less), alkoxysilanes (e.g., tetramethoxysilane (TMOS), tetraethoxysilane (TEOS), tetra-n-propoxysilane, tetra-n-butoxysilane), alkoxysilanes with amino groups (e.g., aminotriethoxysilane, hexaethoxydisilazane), alkoxysilanes with one or more halogen pseudohalogen groups (e.g., triethoxychlorosilane, triethoxyfluorosilane, triethoxy(isocyanato)silane, diethoxydichlorosilane), or combinations thereof. For ease of reference, "alkoxysilane" will hereinafter be used to include alkoxysilanes, alkoxysilanes with amino groups and alkoxysilanes with one or more halogen or pseudohalogen groups.

As described herein, the silicon oxide layer may be deposited from a silicon oxide precursor source, e.g., TEOS, or may be thermally deposited silicon oxide. Other typical low-κ materials "low-k dielectric material" corresponds to any material used as a dielectric material in a layered microelectronic device, wherein the material has a dielectric constant less than about 3.5. In certain embodiments, the low-K dielectric materials include low-polarity materials such as silicon-containing organic polymers, silicon-containing hybrid organic/inorganic materials, organosilicate glass (OSG), TEOS, fluorinated silicate glass (FSG), silicon dioxide, silicon oxycarbide, silicon oxynitride, silicon nitride, carbon-doped oxide (CDO) or carbon-doped glass, for example, CORAL™ from Novellus Systems, Inc., BLACK DIAMOND™ from Applied Materials, Inc. (e.g., BD1, BD2, and BD3 designations for PECVD) SiLK™ dielectric resins from Dow (polymers based on crosslinked polyphenylenes by reaction of polyfunctional cyclopentadienone and acetylene-containing materials; see, for example, U.S. Pat. No. 5,965,679, incorporated herein by reference), and NANOGLASS™ of Nanopore, Inc, (Silica aerogel/xerogel (known as nanoporous silica), and the like. It is to be appreciated that the low-κ dielectric materials may have varying densities and varying porosities.

The compositions of the present invention must possess good metal compatibility, e.g., a low etch rate on the interconnect metal and/or interconnector metal silicide material. Metals of interest include, but are not limited to, copper, tungsten, cobalt, molybdenum, aluminum, tantalum, titanium and ruthenium. Silicides of interest include any silicide including the species Ni, Pt, Co, Ta, Mo, W, and Ti, including but not limited to $TiSi_2$, NiSi, $CoSi_2$, NiPtSi, tantalum silicide, molybdenum silicide, and tungsten silicide.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The composition includes aqueous phosphoric acid (e.g., concentrated phosphoric acid) in an amount that is effective to produce desired etching of silicon nitride. The term "aqueous phosphoric acid" refers to an ingredient of the composition that is mixed or combined with other ingredients of the composition to form the composition. The term "phosphoric acid solids" refers to the non-aqueous component of an aqueous phosphoric acid ingredient, or of a composition that is prepared from aqueous phosphoric acid ingredient.

The amount of phosphoric acid solids contained in a composition can be an amount that, in combination with the other materials of an etching composition, will provide desired etching performance, including desired silicon nitride etch rate and selectivity, which typically requires a relatively high amount (concentration) of phosphoric acid solids. For example, an etching composition can contain an amount of phosphoric acid solids that is at least about 50 weight percent based on total weight of the composition, e.g., at least 70, or at least about 80 or 85 weight percent phosphoric acid solids based on total weight of the composition.

To provide a desired amount of phosphoric acid solids, the composition may contain "concentrated" phosphoric acid as an ingredient that is mixed or combined with other ingredients (one ingredient optionally being water, in some form) to produce the composition. "Concentrated" phosphoric acid refers to an aqueous phosphoric acid ingredient that contains a high or maximum amount of phosphoric acid solids in the presence of a low or minimum amount of water and substantially no other ingredients (e.g., less than 0.5 or 0.1 weight percent of any non-water or non-phosphoric acid solids materials). Concentrated phosphoric acid can typically be considered to have at least about 80 or 85 weight percent phosphoric acid solids in about 15 or 20 weight percent water. Alternately, the composition may be considered to include an amount of concentrated phosphoric acid that is diluted with water, meaning for example concentrated phosphoric acid that has been diluted with an amount of water before or after being combined with other ingredients of the etching composition, or an equivalent formed in any manner. As another alternative, an ingredient of the composition can be concentrated phosphoric acid or a diluted phosphoric acid, and the etching composition can contain an additional amount of water that is provided to the composition either as a component of a different ingredient or as a separate water ingredient.

As an example, if concentrated phosphoric acid is used to form the composition, the amount of concentrated phosphoric acid (85 weight percent, in water) can be an amount that is at least 60, e.g., at least 80 or at least 90, 93, 95, or at least 98 weight percent of the composition, based on total weight of the composition.

The compositions can comprise, consist of, or consist essentially of the recited ingredients and any combination of optional ingredients. As a general convention throughout the present description, the composition as described, or an ingredient or component thereof, that is said to "consist essentially of" a group of specified ingredients or materials refers to a composition that contains the specified ingredients or materials with not more than a low or insignificant amount of other ingredients or materials, e.g., not more than 5, 2, 1, 0.5, 0.1, or 0.05 parts by weight of other ingredients or materials. For example, a composition that contains materials that consist essentially of: aqueous phosphoric acid, at least one compound chosen from:
tetraalkyldisiloxane-silyldiamines;
linear and cyclic alkylsilazanes,
1,2 bis(n-aminoalkoxy) tetraalkyldisiloxanes,
alkyl, aryl, alkenyl, heteroalkyl/aryl boronic acids,
tungstosilicic acid,
phosphotungstic acid,
poly(vinyl alcohol)l,
poly(vinylpyrrolidone),
O-phosphorylethanolamine,
phosphorylcholine,
phosphatidylserine
trialkylsilylamines,
trialkylsilylurea, and trialkylsilylcarbamates, and a solvent comprising water, and optional ingredients as described herein, means a composition that contains these ingredients and not more than 5, 2, 1, 0.5, 0.1, or 0.05 parts by weight of any other dissolved or un-dissolved material or materials (individually or as a total) other than the identified materials.

As used herein, "fluoride compound" corresponds to species including ionic fluoride ion (F—) or covalently bonded fluorine. It is to be appreciated that the fluoride species may be included as a fluoride species or generated in situ. In certain embodiments, this compound capable of generating ions or the fluoride ion will be derived from HF or moonoflurophosphoric acid. In concentrated phosphoric acid compositions, HF will exist mostly in the form of monofluorophosphoric acid (MFPA). In certain embodiments, the non-volatile MFPA may be used directly in the compositions in order to simplify addition and blending. In other embodiments, the fluoride compound may be chosen from CsF and KF. In other embodiments, the fluoride compound may be chosen from tetramethylammonium hexafluorophosphate; ammonium fluoride; ammonium bifluoride; quaternary ammonium tetrafluoroborates and quaternary phosphonium tetrafluoroborates having the formula $NR'_4BF_4$ and $PR'_4BF_4$, respectively, wherein each R' may be the same as or different from one another and is chosen from hydrogen, straight-chained, branched, or cyclic $C_1$-$C_6$ alkyl (e.g., methyl, ethyl, propyl, butyl, pentyl, hexyl), and straight-chained or branched $C_6$-$C_{10}$ aryl (e.g., benzyl); tetrabutylammonium tetrafluoroborate (TBA-$BF_4$); and combinations thereof. In certain embodiments, the fluoride compound is selected from ammonium fluoride, ammonium bifluoride, quaternary ammonium tetrafluoroborates (e.g., tetramethylammonium tetrafluoroborate, tetraethylammonium tetrafluoroborate, tetrapropylammonium tetrafluoroborate, tetrabutylammonium tetrafluoroborate), quaternary phosphonium tetrafluoroborates, or combinations thereof. In certain embodiments, the fluoride compound comprises ammonium bifluoride, ammonium fluoride, or a combination thereof.

As used in the specification and the appended claims, the singular forms "a," "an" and "the" include their plural referents unless the context clearly dictates otherwise. The terms "containing" or "including" are intended to be synonymous with the term "comprising", meaning that at least the named compound, element, particle, or method step, etc., is present in the composition or article or method, but does not exclude the presence of other compounds, materials, particles, method steps, etc., even if the other such compounds, material, particles, method steps, etc., have the same function as what is named, unless expressly excluded in the claims.

In certain embodiments, the term "alkyl" refers to a straight or branched chain alkyl group having from one to twelve carbon atoms and the term "alkenyl" refers to a straight or branched chain hydrocarbon group having at least one carbon-carbon double bond and from two to twelve carbon atoms.

In one aspect, the invention provides a composition comprising the reaction product of
(A) at least one compound selected from:
tetraalkyldisiloxane-silyldiamines;
linear and cyclic alkylsilazanes,
1,3 bis(n-aminoalkylaminoalkyl) tetraalkyldisiloxanes,
1,3 bis(n-aminoalkyl) tetraalkyldisiloxanes,
alkyl, aryl, alkenyl, heteroalkyl/aryl boronic acids,
tungstosilicic acid,
phosphotungstic acid,
poly(vinyl alcohol),
poly(vinylpyrrolidone),
O-phosphorylethanolamine,
phosphorylcholine,
phosphatidylserine
trialkylsilylamines,
trialkylsilylurea, and
trialkylsilylcarbamates.
(B) phosphoric acid; and
(C) a solvent comprising water.

As used above, the phrase "reaction product of . . . " reflects the circumstances where the starting compounds recited in component (A) hydrolyze to yield other species.

In certain embodiments, the tetraalkyldisiloxane-silyldiamines are compounds having the Formula (I)

wherein each $R^1$ and each $R^2$ is independently chosen from $C_1$-$C_6$ alkyl groups.

In certain embodiments, the alkylsilazanes are compounds having the Formula (II)

wherein $R^3$ is $C_1$-$C_6$ alkyl, $R^4$ is $C_2$-$C_6$ alkenyl, and $R^5$ is aryl.

In certain embodiments, the alkylcyclosilazanes are compounds of the Formula (III) and Formula (IV):

wherein each $R^6$ is independently chosen from $C_1$-$C_6$ alkyl.

In certain embodiments, the polysilazanes are compounds having the Formula (V):

(V)

wherein $R^7$ is hydrogen or $C_1$-$C_6$ alkyl, $R^8$ is $C_1$-$C_6$ alkyl or aryl, and n is an integer from 10 to about 100.

In certain embodiments, the 1,3 bis(n-aminoalkyaminoalkyl) tetraalkyldisiloxanes are compounds of the Formula (VI):

(VI)

wherein each n is independently 1, 2, 3, or 4. An example of such a compound is 1,3-bis(2-aminoethylaminomethyl)tetramethyldisiloxane.

In certain embodiments, the 1,3-bis(n-aminoalkyl)tetraalkyldisiloxane is a 1,3-bis(n-aminoalkyl)tetramethyldisiloxane_compound of the Formula (VII):

(VII)

wherein each n is independently 1, 2, 3, or 4. An example of such a compound is 1,3 bis(3-aminopropyltetramethyldisiloxane).

Tetraalkoxy dimethyl-disiloxanes are compounds of the Formula (VIII):

(VIII)

wherein $R^9$ is $C_1$-$C_6$ alkyl, $R^{10}$ is $C_1$-$C_6$ alkyl or aryl, and $R^1$ is $C_1$-$C_6$ alkyl or $C_2$-$C_8$ alkenyl.

In certain embodiments, the alkyl, aryl, alkenyl, heteroalkyl/aryl boronic acids are compounds of the Formula (IX)

(IX)

wherein $R^{12}$ is chosen from $C_1$-$C_6$ alkyl, $C_2$-$C_8$ alkenyl, aryl, and heteroaryl.

As used herein, the term "tungstosilicic acid" as referred to herein is used in the form of a hydrate and is commercially available. Tungstosilicic acid has the general formula $H_4[Si(W_3O_{10})_4]\cdot xH_2O$ (CAS No. 12027-43-9).

As used herein, the term "Phosphotungstic acid" as referred to herein is used in the form of a hydrate and is commercially available. Phosphotungstic acid has the general formula $H_3[P(W_3O_{10})_4]\cdot xH_2O$ (CAS No. 12501-23-4).

As used herein, "O-phosphorylethanolamine" is used in the form of a water-soluble white powder and is commercially available from Sigma-Aldrich (CAS Number: 1071-23-4).

As used herein, "phosphorylcholine", also known as 2-(trimethylazaniumyl)ethyl hydrogen phosphate, is commercially available from Ambinter SARL. (CAS No. 107-73-3).

As used herein, "phosphatidylserine" is commercially available from numerous sources (CAS No. 51446-62-9).

As used herein, the term "poly(vinyl alcohol)" refers to partially hydrolyzed poly(vinyl alcohol) which has better solubility in aqueous environments and is commercially available from Sigma-Aldrich; the polyvinyl alcohol has a weight average molecular weight ($M_w$) of about 5000 to about 100,000. (CAS No. 25213-24-5).

As used herein, the term "poly(vinylpyrrolidone)" refers to commercially available materials available from Sigma-Aldrich. In certain embodiments, the poly(vinylpyrrolidone) has a weight average molecular weight ($M_w$) of about 5000 to about 100,000. (CAS No. 9003-39-8) As used herein, the term "trialkylsilylamines" refers to compounds having the formula $(R^{13})_3Si-O-R^{14}$, wherein each $R^{13}$ group is independently a $C_1$-$C_6$ alkyl group and $R^{14}$ is hydrogen or a metal cation, such as $K^+$, $Na^+$, $Ca^+$, or $Li^+$.

As used herein, the term "trialkysilylamines" refers to compounds having at least one silyl group, at least one amino group, either of which may be substituted by one or more $C_1$-$C_6$ alkyl groups. Example include N-(trimethylsilyl)diethylamine, N-(triethylsilyl)diethylamine, N-(trimethylsilyl)-di-N-propylamine, N-(trimethylsilyl)dibutylamine N-(trimethylsilyl)dipentylamine N-(trimethylsilyl)dihexylamine, and the like.

As used herein, the term "trialkylsilylurea" refers to compounds having a urea moiety, i.e., a partial structure:

substituted by one or more trialkylsilyl groups or trialkylsilylamino groups. An example of such a compound is 1,3-Bis(trimethylsilyl)urea, commercially available from Sigma-Aldrich (CAS No. 18297-63-7).

The term "trialkylsilylcarbamates" refers to compounds having a carbamate moiety, i.e., a partial structure:

substituted by one or more $C_1$-$C_6$ alkyl groups and at least one $C_1$-$C_6$ trialkylsilyl groups. An example of such a compound is N,O-(trimethylsilyl)carbamate, available from Sigma-Aldrich (CAS No. 35342-88-2).

As used herein, the term "$C_1$-$C_6$ alkyl" refers to straight or branched-chain saturated hydrocarbon groups, containing from one to six carbon atoms. Included are groups such as methyl, ethyl, n-propyl, isopropyl, n-butyl, isobutyl, t-butyl, n-pentyl, isopentyl, amyl, n-hexyl, and isohexyl.

As used herein the term "$C_2$-$C_8$ alkenyl" refers to a straight or branched chain hydrocarbon radical that contains at least one carbon-carbon double bond and three to eight carbon atoms.

As used herein, "aryl" includes phenyl and napthyl and such groups substituted with one to three groups chosen from $C_1$-$C_6$ alkyl, $C_1$-$C_6$ alkoxy, —CN, —$NO_2$, $C_1$-$C_6$ alkoxycarbonyl, $C_1$-$C_6$ alkanoyloxy, $C_1$-$C_6$ alkylsulfonyl, hydroxyl, carboxyl, and halogen.

The term "heteroaryl" includes 5 or 6-membered heterocyclic aryl rings containing one oxygen atom, and/or one sulfur atom, and up to three nitrogen atoms, said heterocyclic aryl ring optionally fused to one or two phenyl rings. Examples of such systems include thienyl, furyl, pyrrolyl, imidazolyl, pyrazolyl, thiazolyl, isothiazolyl, oxazolyl, isoxazolyl, triazolyl, thiadiazolyl, oxadiazolyl, tetrazolyl, thiatriazolyl, oxatriazolyl, pyridyl, pyrimidyl, pyrazinyl, pyridazinyl, thiazinyl, oxazinyl, triazinyl, thiadiazinyl, oxadiazinyl, dithiazinyl, dioxazinyl, oxathiazinyl, tetrazinyl, thiatriazinyl, oxatriazinyl, dithiadiazinyl, imidazolinyl, dihydropyrimidyl, tetrahydropyrimidyl, tetrazolo-[1,5-b]pyridazinyl and purinyl, benzoxazolyl, benzothiazolyl, benzimidazolyl, indolyl and the like; such groups are optionally substituted with one to three groups selected from $C_1$-$C_6$-alkyl, $C_1$-$C_6$-alkoxy, —CN, —$NO_2$, $C_1$-$C_6$-alkoxycarbonyl, $C_1$-$C_6$-alkanoyloxy, $C_1$-$C_6$-alkylsulfonyl, and halogen groups.

Many of the compounds of component A tend to hydrolyze to other species in the presence of aqueous phosphoric acid under the conditions typically utilized in a silicon nitride etching method. Several mono- and difunctional silylphosphates formed upon acid hydrolysis will condense with the oxide surface silanol species, inhibiting further etch/dissolution and silicic acid oligomers redeposition during etch.

Figure 2:
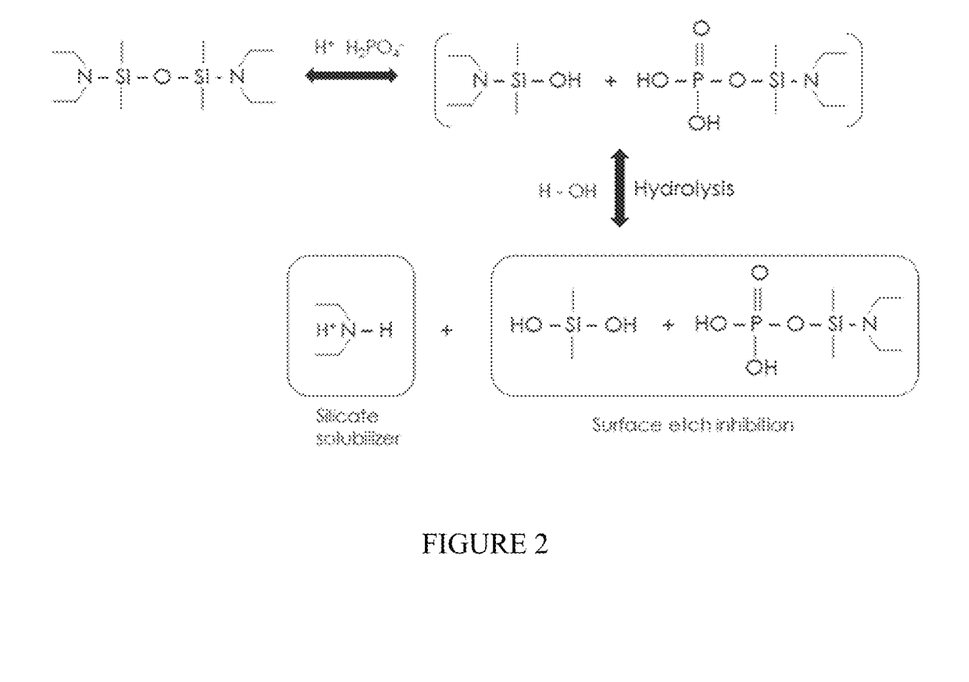
FIG. 2 shows an example of a reaction scheme for forming a silicate solubilizer and a surface etch inhibitor.

In one embodiment, the compound of Formula (I) is $N^1,N^1,N^3,N^3$-tetraethyl-1,1,3,3-tetramethyl-1,3-Disiloxanediamine. Compounds of Formula (I) can also be used in combination with a tetraalkoxy dimethyl-disiloxane of Formula (VIII), such as 1,1,3,3-tetramethoxy-1,3-dimethyl. The compound of Formula (I) was found to hydrolyze in the presence of aqueous phosphoric acid to component compounds which served to passivate the silicon dioxide surfaces and thus inhibit the undesired etching of the silicon dioxide surface in favor of the desired etching of the silicon nitride surfaces. FIG. 2 shows a reaction scheme with an example of a suitable hydrolysis forming a silicate solubilizer and a surface etch inhibitor.

Protonated diethylamine formed during silazane Si—N bond breaking can serve as silicic acid oligomers solubilizer, thus increasing the concentration of soluble silicate species and substantially reducing the undesired silicate redeposition on the oxide features (see for example, FIG. 1D of US 2017/0287725).

In certain embodiments, the phosphoric acid will be present in the composition in about 50 to about 95 weight percent. In other embodiments, phosphoric acid will be present in about 70 to about 90 weight percent, and in other embodiments, about 85 weight percent.

In certain embodiments of the invention, the composition may further comprise a fluoride compound. In one embodiment, the fluoride compound is selected from HF and monofluoro phosphoric acid. In other embodiments, the fluoride compound is selected from cesium fluoride and potassium fluoride. In other embodiments, the fluoride compound is selected from from fluoroboric acid; tetramethylammonium hexafluorophosphate; ammonium fluoride; ammonium bifluoride; quaternary ammonium tetrafluoroborates and quaternary phosphonium tetrafluoroborates having the formula NR'$_4$BF$_4$ and PR'$_4$BF$_4$, respectively, wherein R' may be the same as or different from one another and is selected from hydrogen, straight-chained, branched, or cyclic $C_1$-$C_6$ alkyl, and straight-chained or branched $C_6$-$C_{10}$ aryl; tetrabutylammonium tetrafluoroborate (TBA-BF$_4$); and combinations thereof.

Component (c) is a solvent comprising water. Optionally, the solvent may further comprise one or more water-miscible solvents such as pyrrolidinones, glycols, amines, and glycol ethers, including, but not limited to, methanol, ethanol, isopropanol, butanol, and higher alcohols (such as $C_2$-$C_4$ diols and $C_2$-$C_4$ triols), tetrahydrofurfuryl alcohol (THFA), halogenated alcohols (such as 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, tetraethylene glycol dimethyl ether (TEGDE), dibasic ester, glycerine carbonate, N-formyl morpholine, triethyl phosphate, and combinations thereof. When using an alkoxysilane additive, its hydrolysis generates a small amount of alcohol, for example, methanol or ethanol, which is incorporated into the formulation as the alcohol itself or as its phosphoric acid monoester. In addition, the organic solvent may comprise other amphiphilic species, i.e., species that contain both hydrophilic and hydrophobic moieties similar to surfactants.

In certain embodiments, the compositions of the invention further comprise low molecular weight amines and amine phosphate salts. In other embodiments, the low molecular weight amines and amine phosphate salts are primary, secondary, or tertiary $C_1$-$C_6$ alkylamine or phosphate salts thereof. Examples include trimethylamine, trimethylamine, tripropylamine, tributylamine and the like. It will be appreciated that when such amines are added to a concentrated H3PO4 composition, amine phosphate salts will form.

The composition may optionally comprise surfactant(s) (different from the other optional or required ingredients of the present description) to improve performance of the composition. As used herein the term "surfactant" refers to an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. Preferred surfactants are thermally stable and stay ionic under strongly acidic conditions such as the conditions of an etching process of the present invention. Examples include perfluoroalkylsulfonic acids and long-chain quaternary ammonium compounds (e.g. dodecyltrimethylammonium hydrogen sulfate).

Fluorinated non-ionic surfactants such as Chemours' Capstone® FS-31/FS-35 can also be used. Non-ionic non-fluorinated surfactants such as poly(ethylene glycol)-poly (propylene glycol) copolymers ("PEG-PPG") can also be used, and are better suited for the lower-temperature, lower-acidity part of the operating range (e.g., 100-130° C. and 50-75% $H_3PO_4$).

The amount of surfactant in the composition can be an amount that, in combination with the other materials of an etching composition, will provide desired overall performance. For example, the composition can contain an amount of surfactant that may be in a range from about 0.001 to about 10 weight percent, e.g., from about 0.01 to about 0.5, 1, 2, 7, or 7 weight percent surfactant based on total weight of the composition.

Optionally, the compositions can contain an amount of carboxylic acid compound, meaning an organic compound that contains at least one carboxylic acid group. According to the invention, the presence of a carboxylic acid compound in composition as described can improve performance by inhibiting redeposition of silicon oxide or formation of particles of the same. In certain embodiments, the carboxylic acid compounds for use in the compositions include acetic acid, malonic acid, succinic acid, 2-methylsuccinic acid, glutaric acid, adipic acid, salicylic acid, 1,2,3-propanetricarboxylic acid (a.k.a. tricarballylic acid), 2-phosphonoacetic acid, 3-phosphonopropanoic acid, and 2-phosphonobutane-1,2,4-tricarboxylic acid (PBTCA), any of which may be used alone, in combination together with each other, or in combination with a different carboxylic acid compound.

The amount of carboxylic acid compound (including derivatives thereof) contained in the compositions can be an amount that, in combination with the other materials of the compositions, will provide desired etching performance while not otherwise affecting performance or chemical stability of an etching composition. For example, the compositions can contain an amount of carboxylic acid compound, which may be a single species or a combination of two or more species, in a range from about 0.01 to about 10 weight percent based on total weight of the composition, or from about 0.1 to about 5 or 8 weight percent based on total weight of the composition.

The composition may contain water from one or from multiple sources. For example, water will be present in an aqueous phosphoric acid ingredient.

Additionally, water may be used as a carrier for one or more of the other ingredients of the etching composition, and water may be added alone as its own ingredient. The amount of water should be sufficiently low to allow the composition to exhibit desired or preferred or advantageous etching performance properties, including a useful (sufficiently high) silicon nitride etch rate. An increase in the presence of water tends to increase the etch rate of silicon nitride but can also depress the boiling point of the etching composition, which forces a reduction in operating temperature of the etching composition and an opposite effect. Examples of amounts of water, from all sources, in an etching composition, can be less than about 50, 40, or 30 weight percent, for example in a range from about 5 weight percent to about 25 percent by weight, based on total weight of the composition, or in a range from about 10 to 20 weight percent water based on total weight of the composition.

Optionally, these and other example compositions as described can contain, consist of, or consist essentially of the phosphoric acid, the component A materials, and any one or any combination of the identified optional ingredients. Certain embodiments of the compositions of the invention do not require and may exclude other types of ingredients not typically included in an etching composition, such as a pH adjusting agent (other than the acids mentioned as potential ingredients herein) and solid materials such as abrasive particles.

In yet another aspect, the invention provides a method for removing silicon nitride from a microelectronic device, said method comprising contacting the microelectronic device with a composition of the present invention, for sufficient time under sufficient conditions to at least partially remove said silicon nitride material from the microelectronic device.

For example, silicon nitride material may be removed without substantially damaging metal and metal silicide interconnect materials. The invention thus provides methods for selectively and substantially removing silicon nitride materials relative to polysilicon and/or silicon oxide materials from the surface of the microelectronic device having same thereon using the compositions described herein. The metal silicide materials that are present are not substantially corroded by said removal compositions using said method.

In etching application, the composition is applied in any suitable manner to the surface of the microelectronic device having the silicon nitride material thereon, e.g., by spraying the removal composition on the surface of the device, by dipping (in a static or dynamic volume of the removal composition) of the device including the silicon nitride material, by contacting the device with another material, e.g., a pad, or fibrous sorbent applicator element, that has the removal composition absorbed thereon, by contacting the device including the silicon nitride material with a circulating removal composition, or by any other suitable means, manner or technique, by which the removal composition is brought into removal contact with the silicon nitride material. The application may be in a batch or single wafer apparatus, for dynamic or static cleaning. In one embodiment, the application of the removal composition to the surface of the microelectronic device is controlled agitation whereby the composition is circulated through the container housing said composition. Active agitation, e.g., turbulence, stirring, etc., is not recommended when the etch rates of silicide and/or poly-Si are preferably low. However, for removal of silicon nitride from high aspect ratio structures, stirring may be desired, both for faster liquid exchange in and out of the structure and to minimize redeposition of oxide.

The compositions of the present invention, by virtue of their selectivity for silicon nitride material relative to other materials that may be present on the microelectronic device structure and exposed to the composition, such as metallization, polysilicon, silicon oxide(s), etc., achieve at least partial removal of the silicon nitride material in a highly efficient and highly selective manner.

In use of the compositions of the invention for removing silicon nitride material from microelectronic device structures having same thereon, the composition typically is contacted with the microelectronic device structure for a sufficient time of from about 1 minute to about 200 minutes, in one embodiment, about 15 minutes to about 100 minutes, or about 1 minute to about 2 minutes for a single wafer tool, at sufficient conditions including, but not limited to, in one embodiment, a temperature in a range of from about 40° C. to about 120° C., or in another embodiment, about 60° C. to about 95° C. Such contacting times and temperatures are illustrative, and any other suitable time and temperature conditions may be employed that are efficacious to at least partially remove the silicon nitride material from the device structure, within the practice of the invention.

Following the achievement of the desired removal action, the removal composition is readily removed from the microelectronic device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry, etc.).

The compositions of the invention selectively etch silicon nitride material relative to poly-Si and silicon oxides from the surface of the microelectronic device without causing substantial corrosion of the metal and/or metal silicide interconnect material(s). For example, the selectivity of silicon nitride to silicon oxide(s) in the presence of the removal compositions of the invention are, in one embodiment, in a range from about 10:1 to about 7,000:1, in another embodiment about 30:1 to about 3,000:1, and in another embodiment about 100:1 to about 2000:1 at temperatures of 40-100° C. in one embodiment, of 60-95° C. in another embodiment, and of 75-90° C. in yet another embodiment. When the silicic acid source includes an alkoxysilane, e.g., TEOS, the selectivity of silicon nitride relative to silicon oxide(s) can be tuned from about 20:1 to infinity in one embodiment and in the range from about 20:1 to about 7,000:1 in another embodiment. In fact, the selectivity is formally negative for fluorosilicic acid/TEOS molar ratios below about 4, reflecting the fact that the thickness of the oxide film is slightly but measurably increased by precipitation of silica. When the silicic acid source includes fine silica powder, the observed selectivity of silicon nitride relative to silicon oxide(s) is in the range of about 20:1 to about 100:1 but higher selectivity may be obtained by longer equilibration times (or higher equilibration temperature) of the silica powder with the fluorosilicic acid.

An etching step of the present description can be useful to etch silicon nitride material from a surface of any type of substrate. According to particular embodiments, a substrate can include alternating thin film layers of silicon nitride as structural features of a substrate that includes alternating thin film layers of the silicon nitride layers with silicon oxide. The silicon oxide layers are high aspect ratio structures that contain the silicon nitride layers disposed between the layers of silicon oxide.

A still further aspect of the invention relates to methods of manufacturing an article comprising a microelectronic device, said method comprising contacting the microelectronic device with the compositions of the present invention for sufficient time to etchingly remove silicon nitride material from the surface of the microelectronic device having same thereon, and incorporating said microelectronic device into said article.

The compositions described herein are easily formulated by simple addition of the respective ingredients and mixing to homogeneous condition. Furthermore, the compositions may be readily formulated as single-package formulations or multi-part formulations that are mixed at the point of use. The individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Another aspect of the invention relates to a kit including, in one or more containers, one or more components adapted to form the compositions described herein. In one embodiment, the kit includes, in one or more containers, the combination of at least one of components (A)-(C) above for combining with water at the fab or the point of use. The containers of the kit must be suitable for storing and shipping said cleaning composition components, for example, NOWPak®. containers (Entegris, Inc., Danbury, Conn., USA). The one or more containers which contain the components of the first cleaning composition preferably include means for bringing the components in said one or more containers in fluid communication for blending and dispense. For example, referring to the NOWPak®. containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended cleaning composition to a process tool.

Substantially chemically inert, impurity-free, flexible and resilient polymeric film materials, such as high density polyethylene, may be used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Exemplary thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S.

Patent Application No. 60/916,966 entitled "SYSTEMS AND METHODS FOR MATERIAL BLENDING AND DISTRIBUTION" filed on May 9, 2007 in the name of John E. Q. Hughes, and PCT/US08/63276 entitled "SYSTEMS AND METHODS FOR MATERIAL BLENDING AND DISTRIBUTION" filed on May 9, 2008 in the name of Advanced Technology Materials, Inc.

Accordingly, in a further aspect, the invention provides a kit comprising one or more containers having components therein suitable for removing silicon nitride from a microelectronic device, wherein one or more containers of said kit contains components A, B, and C as set forth herein.

This invention can be further illustrated by the following examples of preferred embodiments thereof, although it will be understood that these examples are included merely for purposes of illustration and are not intended to limit the scope of the invention unless otherwise specifically indicated.

EXPERIMENTAL SECTION

| Ex. # | $SiO_2$ Inhibitor | $SiO_2$* ER A/min | $Si_3N_4$* ER A/min | Selectivity* | $SiO_2$** ER A/min | $Si_3N_4$** ER A/min | Selectivity** |
|---|---|---|---|---|---|---|---|
| Ctrl 1 | None | 0.6823 | 33.9 | 49.73 | 0.11 | 72.3 | 657 |
| Ctrll 2 | APST | 0.5261 | 38.8 | 73.75 | 0.04 | 150 | 3750 |
| 1 | NTTDSDA | 0.2869 | 27 | 94.02 | 0.01 | 145.8 | 1458 |
| 2 | HMCTSZ | 0.2542 | 25.2 | 99.23 | | | |
| 3 | AEAMTMD | 0.2576 | 29.4 | 114.25 | 0.06 | 170 | 2724.5 |
| 4 | NTTDSDA | 0.315 | 32 | 101.6 | | | |
| 5 | NTTDSDA + Disiloxane (0.001 moles) | 0.001 | 31.4 | 31400 | 0.06 | 145.2 | 2231.046 |
| 6 | NTTDSDA + disiloxane (0.002 moles) | 0.001 | 46.1 | 46100 | 0.02 | 148.4 | 7420 |
| 7 | PyBA | 0.465 | 25.4 | 84.53 | | | |
| 8 | PhBA | 0.37 | 29.7 | 80.23 | | | |
| 9 | O-PPEA | 0.2 | 34.9 | 164.1 | 0.2 | 210.7 | 1050 |

In the table above:
NTTDSDA = $N^1,N^1,N^3,N^3$-tetraethyl-1,1,3,3-tetramethyl-1,3-disiloxanediamine
APST = (3-aminopropyl)silane triol (CAS No. 58160-99-9)
HMCTSZ = 2,2,4,4,6,6-hexamethylcyclotrisilazane
AEAMTMD = 1,3-bis(2-aminoethylaminomethyl)tetramethyldisiloxane
disiloxane = 1,1,3,3-tetramethoxy-1,3-tetramethyl disiloxane
PyBA = 4-pyridylboronic acid
PhBA = phenylboronic acid
O-PPEA = O-phosphorylethanolamine ($Si_3N_4$ etch accelerator)
*$SiO_2$, $Si_3N_4$ films - deposition technique A
**$SiO_2$, $Si_3N_4$ films - deposition technique B Selectivity is variable depending on the $SiO_2$ and $Si_3N_4$ deposition techniques (precursors, ratios, temperature, etc.), resulting in different surface chemistry of the oxide and nitride films (functional groups, condensation degree). For instance, $SiO_2$ films with higher surface silanol condensation, less free silanol (—Si—OH) groups and more surface siloxane (—O—Si—O—) groups will etch slower, while $Si_3N_4$ films with higher primary and secondary amine groups concentration and less tertiary amines surface and bulk concentration will etch faster.

Figure 1:
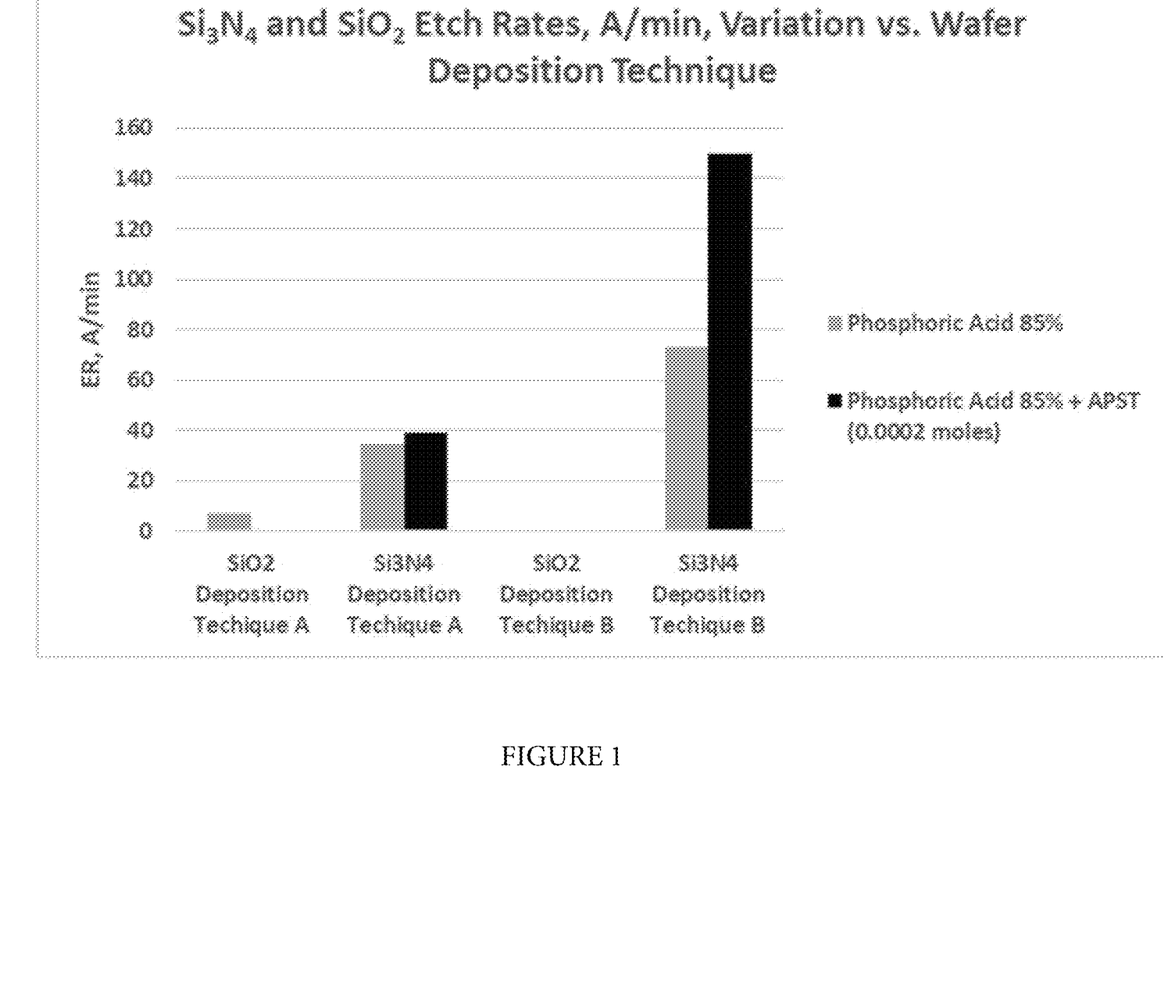
FIG. 1 shows the selectivity variation for two etch formulations on different types of oxide and nitride substrates with different surface chemistry, made by different deposition techniques. Etch rate in angstroms per minute on the substrates listed is plotted comparing (i) 85% phosphoric acid and (ii) 85% phosphoric acid combined with 0.0002 moles of (3-aminopropyl)silane triol.

FIG. 1 shows the selectivity variation for two etch formulations on different types of oxide and nitride substrates with different surface chemistry, made by different deposition techniques:

The invention has been described in detail with particular reference to certain embodiments thereof, but it will be understood that variations and modifications can be affected within the spirit and scope of the invention.

The invention claimed is:

1. A composition comprising the reaction product of
    (A) at least one compound selected from the group consisting of:
        tetraalkyldisiloxane-silyldiamines and
        O-phosphorylethanolamine,
    (B) phosphoric acid;
    (C) a fluoride compound; and
    (D) a solvent comprising water,
    wherein the fluoride compound is chosen from the group consisting of cesium fluoride; potassium fluoride; monofluorphosphoric acid; fluoroboric acid; tetramethylammonium hexafluorophosphate; ammonium fluoride; ammonium bifluoride; quaternary ammonium tetrafluoroborates and quaternary phosphonium tetrafluoroborates having the formula $NR'_4BF_4$ and $PR'_4BF_4$, respectively, wherein R' may be the same as or different from one another and is selected from hydrogen, straight-chained, branched, or cyclic $C_1$-$C_6$ alkyl, and straight-chained or branched $C_6$-$C_{10}$ aryl; tetrabutylammonium tetrafluoroborate ($TBA$-$BF_4$); and combinations thereof, and
    wherein composition is an etching composition for selectively etching silicon nitride.

2. The composition of claim 1, further comprising a primary, secondary, or tertiary $C_1$-$C_6$ alkylamine, $C_1$-$C_6$ alkanolamine, or dihydrogen phosphate salt thereof.

3. The composition of claim 2, wherein the primary, secondary, or tertiary $C_1$-$C_6$ alkylamine is chosen from trimethylamine or triethanolamine.

4. The composition of claim 1, wherein the composition comprises tetraalkyldisiloxane-silyldiamines and the tetraalkyldisiloxane-silyldiamines are compounds having the Formula (I)

wherein each $R^1$ and each $R^2$ is independently chosen from $C_1$-$C_6$ alkyl groups.

5. The composition of claim 4, wherein the compound of Formula (I) is $N^1,N^1,N^3,N^3$-tetraethyl-1,1,3,3-tetramethyl-1,3-disiloxanediamine.

6. The composition of claim 1 further comprising a tetraalkoxydialkyl-disiloxane compound of the Formula (VIII):

wherein $R^9$ is $C_1$-$C_6$ alkyl, $R^{10}$ is $C_1$-$C_6$ alkyl, and $R^{11}$ is $C_1$-$C_6$ alkyl or $C_2$-$C_8$ alkenyl.

7. The composition of claim 6, wherein the compound of Formula (VIII) is 1,1,3,3-tetramethoxy-1,3-dimethyl disiloxane.

8. A method for removing silicon nitride from a microelectronic device, said method comprising contacting the microelectronic device with a composition comprising:
(A) at least one compound selected from the group consisting of:
tetraalkyldisiloxane-silyldiamines, and
O-phosphorylethanolamine,
(B) phosphoric acid;
(C) a fluoride compound; and
(D) a solvent comprising water,
wherein the fluoride compound is chosen from the group consisting of cesium fluoride; potassium fluoride; monofluorphosphoric acid; fluoroboric acid; tetramethylammonium hexafluorophosphate; ammonium fluoride; ammonium bifluoride; quaternary ammonium tetrafluoroborates and quaternary phosphonium tetrafluoroborates having the formula $NR'_4BF_4$ and $PR'_4BF_4$, respectively, wherein R' may be the same as or different from one another and is selected from hydrogen, straight-chained, branched, or cyclic $C_1$-$C_6$ alkyl, and straight-chained or branched $C_6$-$C_{10}$ aryl; tetrabutylammonium tetrafluoroborate (TBA-$BF_4$); and combinations thereof.

9. A composition comprising the reaction product of
(A) at least one compound selected from the group consisting of:
tetraalkyldisiloxane-silyldiamines,
1,3-bis(n-aminoalkyl)tetraalkyldisiloxanes, and
O-phosphorylethanolamine,
(B) phosphoric acid;
(C) a fluoride compound; and
(D) a solvent comprising water,
wherein the fluoride compound is chosen from the group consisting of cesium fluoride; potassium fluoride; monofluorphosphoric acid; fluoroboric acid; tetramethylammonium hexafluorophosphate; ammonium fluoride; ammonium bifluoride; quaternary ammonium tetrafluoroborates and quaternary phosphonium tetrafluoroborates having the formula $NR'_4BF_4$ and $PR'_4BF_4$, respectively, wherein R' may be the same as or different from one another and is selected from hydrogen, straight-chained, branched, or cyclic $C_1$-$C_6$ alkyl, and straight-chained or branched $C_6$-$C_{10}$ aryl; tetrabutylammonium tetrafluoroborate (TBA-$BF_4$); and combinations thereof, the composition further comprising a tetraalkoxydialkyl-disiloxane compound of the Formula (VIII):

wherein $R^9$ is $C_1$-$C_6$ alkyl, $R^{10}$ is $C_1$-$C_6$ alkyl, and $R^{11}$ is $C_1$-$C_6$ alkyl or $C_2$-$C_8$ alkenyl, and
wherein composition is an etching composition for selectively etching silicon nitride.

10. The composition of claim 9, wherein the compound of Formula (VIII) is 1,1,3,3-tetramethoxy-1,3-dimethyl disiloxane.

* * * * *